United States Patent
Kobayashi et al.

(10) Patent No.: US 8,716,209 B2
(45) Date of Patent: May 6, 2014

(54) AGENT FOR POST-ETCH TREATMENT OF SILICON DIELECTRIC FILM, METHOD OF MANUFACTURING SEMICONDUCTOR DEVICE, AND SEMICONDUCTOR DEVICE

(75) Inventors: Yasushi Kobayashi, Kawasaki (JP); Kouta Yoshikawa, Kawasaki (JP); Yoshihiro Nakata, Kawasaki (JP); Tadahiro Imada, Kawasaki (JP); Shirou Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 785 days.

(21) Appl. No.: 12/560,193

(22) Filed: Sep. 15, 2009

(65) Prior Publication Data

US 2010/0007031 A1     Jan. 14, 2010

Related U.S. Application Data

(63) Continuation of application No. PCT/JP2007/000237, filed on Mar. 16, 2007.

(51) Int. Cl.
*H01L 21/306* (2006.01)
*C11D 11/00* (2006.01)
*H01L 21/3105* (2006.01)

(52) U.S. Cl.
CPC ......... *C11D 11/0047* (2013.01); *H01L 21/3105* (2013.01)
USPC ............................................. 510/175; 134/2

(58) Field of Classification Search
CPC ................. C11D 11/0047; H01L 21/3105
USPC ............................................. 510/175; 134/2
See application file for complete search history.

(56) References Cited

U.S. PATENT DOCUMENTS 6,410,150 B1 * 6/2002 Kurosawa et al. ............ 428/447
7,291,567 B2 * 11/2007 Tsuchiya et al. .............. 438/761
(Continued)

FOREIGN PATENT DOCUMENTS

| JP | 2001-033988 A | 2/2001 |
| JP | 3585384 B2 | 11/2004 |
| JP | 2006-179913 A | 7/2006 |
| SU | 1035093 A1 | 8/1983 |

OTHER PUBLICATIONS

Japanese Office Action dated Dec. 27, 2011, issued in corresponding Japanese Patent Application No. 2009-504902.

(Continued)

*Primary Examiner* — Gregory Webb
(74) *Attorney, Agent, or Firm* — Westerman, Hattori, Daniels & Adrian, LLP

(57) ABSTRACT

The invention provides an agent for post-etch treating a silicon dielectric film, including: at least one nitrogen-containing substance selected from the group consisting of ammonium bases and amine compounds; an acid; and at least one silicon-containing compound containing silicon, carbon and hydrogen. According to the present invention, it becomes possible to suppress an increase in the dielectric constant of a silicon dielectric film caused by etching.

28 Claims, 7 Drawing Sheets

(56) References Cited

U.S. PATENT DOCUMENTS

| | | | |
|---|---|---|---|
| 7,709,371 B2* | 5/2010 | Bhanap et al. | 438/623 |
| 8,053,159 B2* | 11/2011 | Li et al. | 430/270.1 |
| 2003/0008155 A1* | 1/2003 | Hayashi et al. | 428/447 |
| 2003/0109395 A1 | 6/2003 | Neumiller | |
| 2005/0215072 A1 | 9/2005 | Kevwitch et al. | |
| 2006/0130966 A1 | 6/2006 | Babic et al. | |
| 2006/0281662 A1 | 12/2006 | Cheung et al. | |
| 2007/0015892 A1* | 1/2007 | Nakagawa et al. | 528/25 |
| 2008/0268264 A1* | 10/2008 | Akiyama et al. | 428/447 |

OTHER PUBLICATIONS

International Search Report of PCT/JP2007/000237, Mailing Date of May 22, 2007.
Extended European Search Report mailed Jun. 18, 2012, issued in corresponding European Patent Application No. 07736894.
European Office Action dated Apr. 19, 2013, issued in corresponding European Patent Application No. 07736894.2.
Chinese Office Action dated Dec. 6, 2012, issued in corresponding Chinese Patent Application No. 200780052187.8 (12 pages).

* cited by examiner

FIG. 4
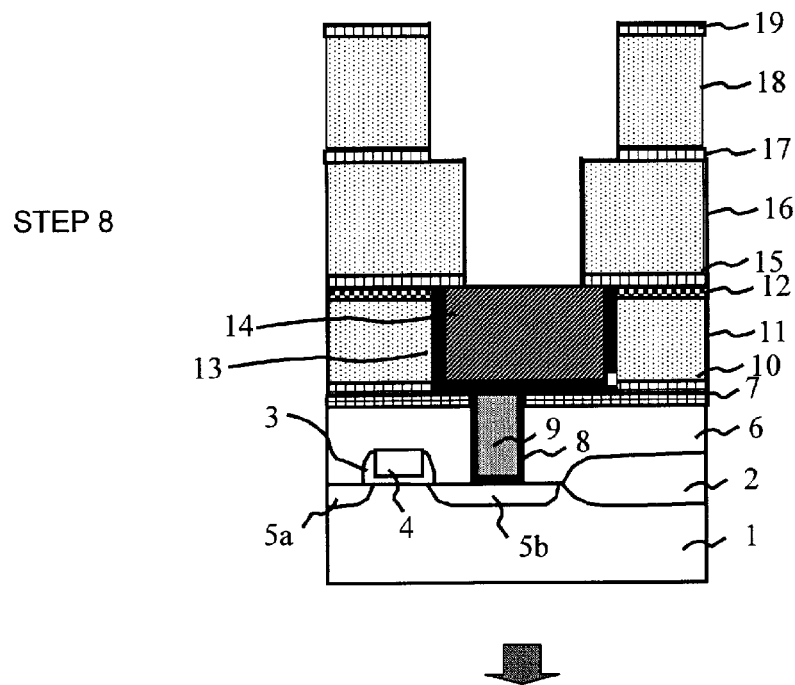
STEP 8
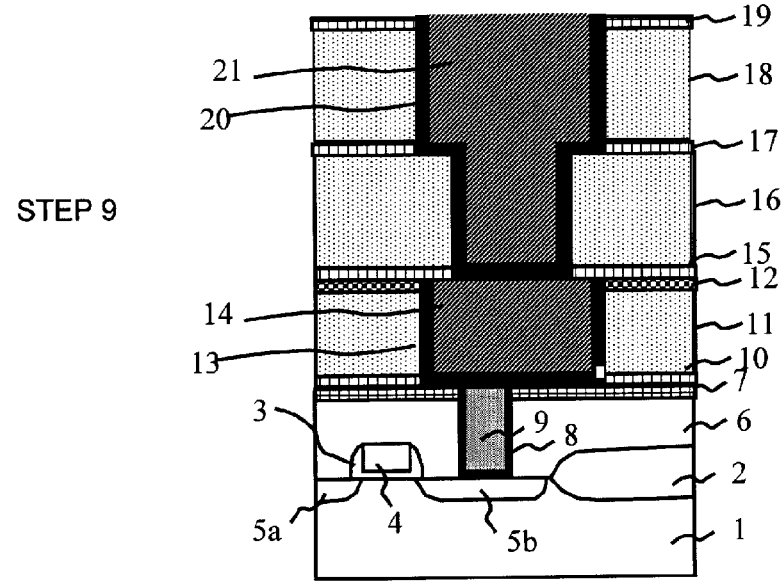
STEP 9

STEP 10

FIG. 6
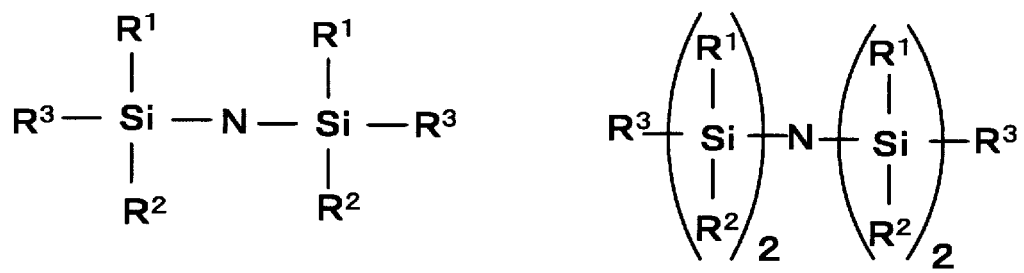
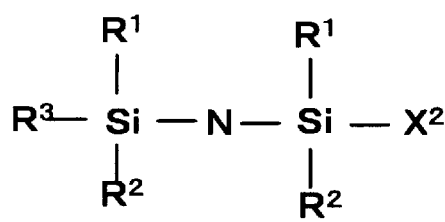
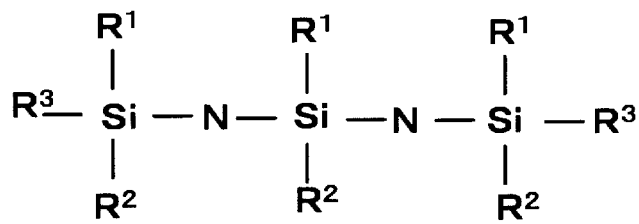
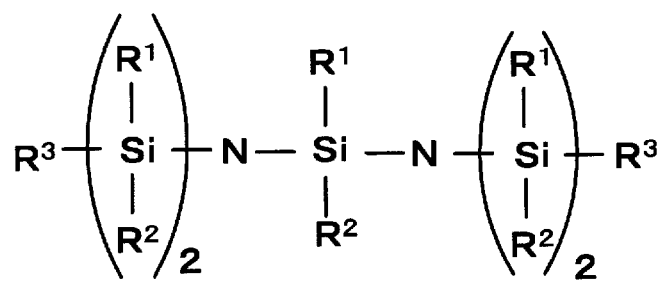

US 8,716,209 B2

AGENT FOR POST-ETCH TREATMENT OF SILICON DIELECTRIC FILM, METHOD OF MANUFACTURING SEMICONDUCTOR DEVICE, AND SEMICONDUCTOR DEVICE

CROSS REFERENCE TO RELATED APPLICATIONS

This application is a continuation of International Application No. PCT/JP2007/000237, filed on Mar. 16, 2007, now pending, herein incorporated by reference.

FIELD

The present invention relates to the post-etch treatment of dielectric films in semiconductor devices and the like.

BACKGROUND

With the rising level of integration in semiconductor devices and integrated circuits and with higher device densities, there has been a growing demand for multilayer structures, particularly in semiconductor device elements. This trend toward higher integration results in narrower line spacings, leading to the problem of wire delay due to the increased capacitance between lines (see Japanese Patent Publication No. 3585384).

More specifically, although declines in signal propagation speed due to the parasitic capacitance of dielectric films have hitherto been known to occur, in generations of semiconductor devices with line spacings of more than 1 µm, wire delay had only a small effect on the device as a whole. However, at line spacings of 1 µm or less, the effect of wire delay on device speed increases; in particular, when circuits come to be formed at line spacings of 0.1 µm or less, the parasitic capacitance between lines will exert a large influence on device speed.

Wire delay (T) is affected both by the line resistance (R) and the capacitance (C) between lines, as illustrated by formula (4) below.

$$T \propto CR \quad (4)$$

In formula (4), the relationship between $\in$ (dielectric constant) and C is depicted in formula (5).

$$C = \in_o \in_r S/d \quad (5)$$

In formula (5), S is the electrode surface area, $\in_o$ is the dielectric constant of a vacuum, $\in_r$ is the dielectric constant of the dielectric film, and d is the line spacing.

Hence, lowering the dielectric constant of the dielectric film is an effective way to make the wire delay smaller.

At present, low dielectric constant dielectric films in semiconductor devices and integrated circuits are primarily made of silicon compound-based materials. However, when a silicon compound-based material is etched in the process of forming multilayer wiring, the surface becomes hydrophilic, leading to a rise in the dielectric constant due to the influence of water adsorption thereto (etching damage), a rise in the dielectric constant due to etching residues, and a deterioration in adhesion with overlying layers. These are impediments to high-speed operation and high reliability in semiconductor devices and integrated circuits (see Japanese Patent Application Laid-open No. 2001-33988).

It is therefore an object of the present invention to provide an agent for the post-etch treatment of silicon-based dielectric films, which agent is able to suppress a rise in the dielectric constant of the silicon-based dielectric film. Other objects and advantages of the invention will become apparent from the following description.

SUMMARY

According to one aspect, an agent for post-etch treating a silicon dielectric film, includes: at least one nitrogen-containing substance selected from the group consisting of ammonium bases and amine compounds; an acid; at least one silicon-containing compound containing silicon, carbon and hydrogen, and optionally a surfactant.

BRIEF DESCRIPTION OF DRAWINGS

FIGS. 1 to 7 depict steps of forming multilayer wiring;

DESCRIPTION OF EMBODIMENTS

Figure 1:
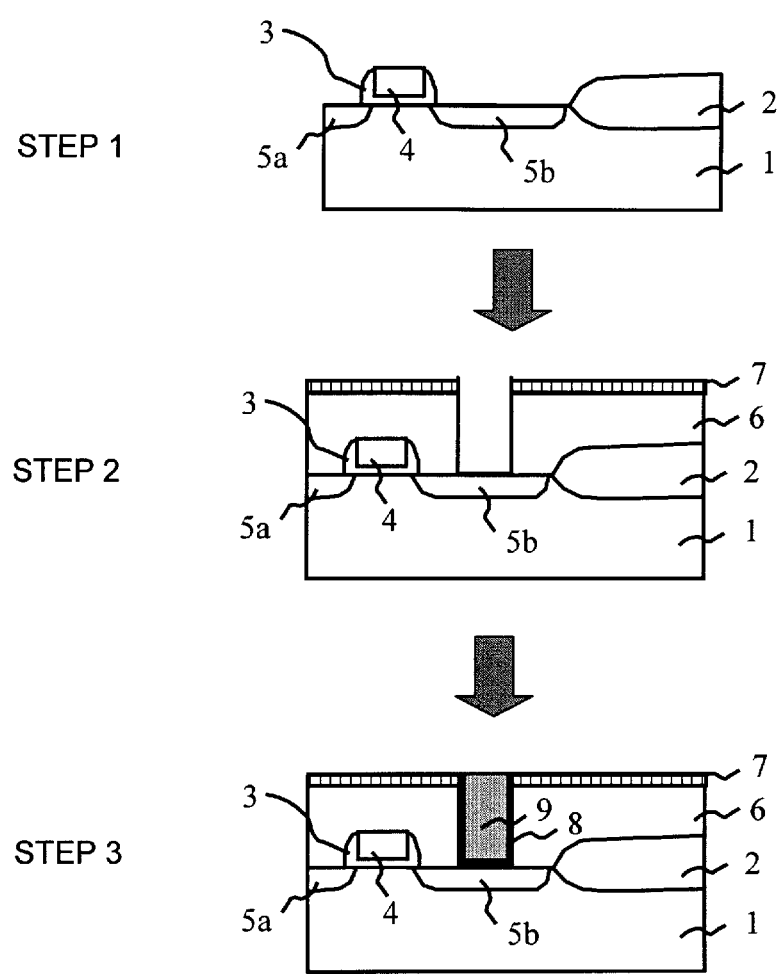
Figure 2:
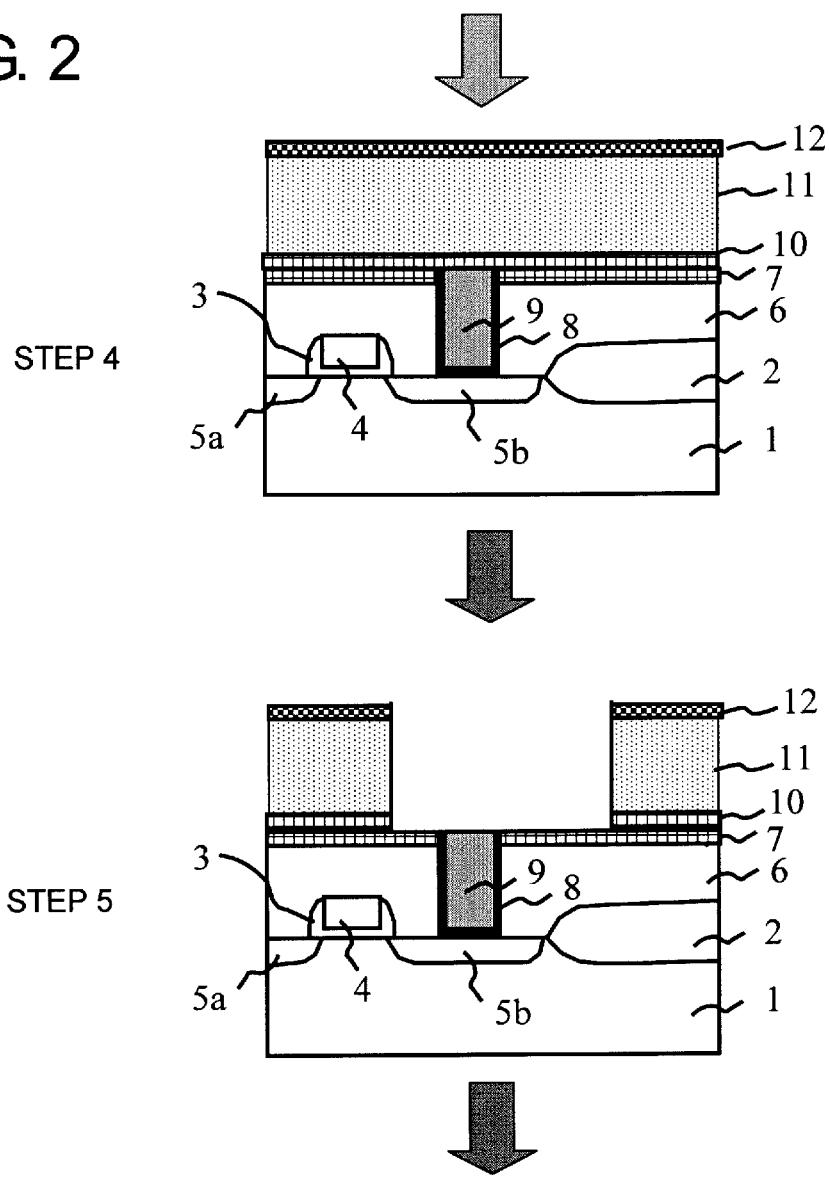
Figure 3:
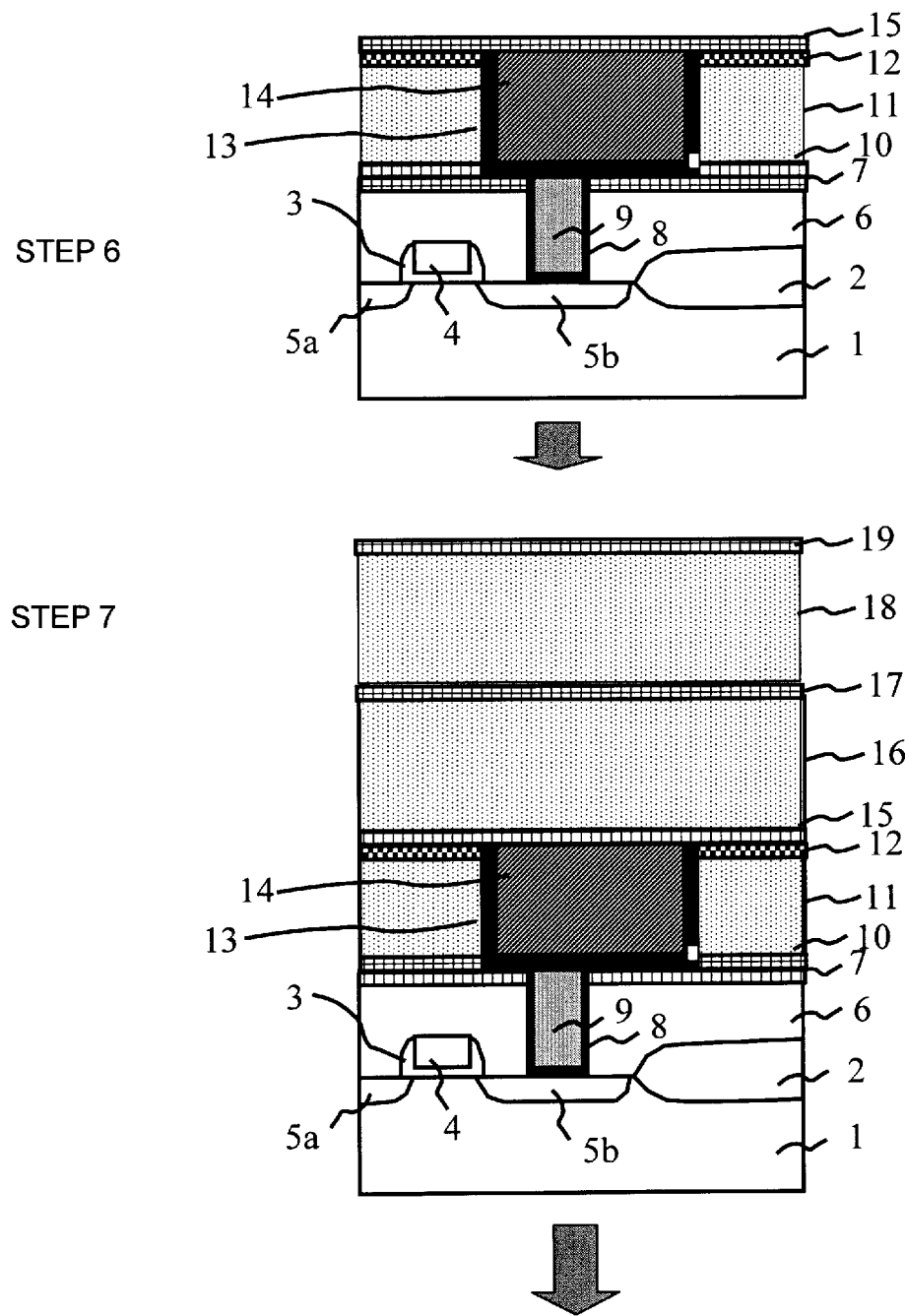
Figure 5:
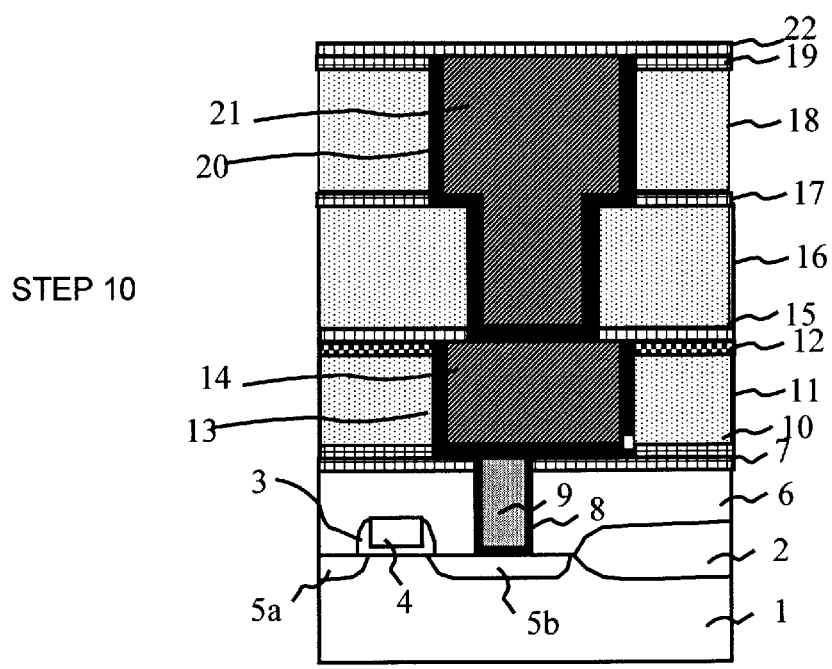

Embodiments of the present invention will now be described with reference to drawings, tables, formulas, and embodiments. The drawings, table, formulas, and embodiments are for assisting the understanding of the present invention, and not for limiting the application of the present invention to these embodiments. The protective scope of the present invention covers the inventions defined in the claims and their equivalents, and is not limited to the above embodiments.

[Agent for Post-Etch Treating a Silicon Dielectric Film]

The embodiment agent for post-etch treating a silicon dielectric film includes (1) at least one nitrogen-containing substance selected from the group consisting of ammonium bases and amine compounds, (2) an acid, (3) at least one silicon-containing compound containing silicon, carbon and hydrogen, and optionally (4) a surfactant.

The present embodiment makes it possible to suppress an increase in the dielectric constant of a silicon dielectric film in etching. Moreover, it can suppress film separation and uneven film formation when a film of barrier metal or the like is formed, thus enabling the formation of a uniform film having a good adhesion.

From other perspectives, the present embodiment provides art which enables recovery from damage caused by etching and art which enables the efficient cleaning of etching residues.

The inventive agent for post-etch treating a silicon dielectric film may preferably be used as an agent for post-etch treating various types of silicon dielectric films in the manufacture of semiconductor devices. Semiconductor devices obtained in this way are able to achieve a low dielectric constant, in addition to which adhesion between the silicon dielectric film and the overlying layer is good. Hence, the quality of products such as semiconductor devices manufactured by a process that includes a silicon dielectric film etching step can be improved, semiconductor devices having a high speed and a high reliability can be achieved, and the manufacturing yield can be enhanced.

As used herein, "damage caused by etching" refers to, as a result of etching, a worsening (increase) in the dielectric constant thought to be associated with hydrophilization of the etched surface. Also, "recovery from" such damage means to lower the dielectric constant that had been elevated.

It has been discovered that when a silicon dielectric film (such as on a wiring layer) is treated, after etching, with an aqueous solution containing the above-described nitrogen-containing substance and the above-described silicon-containing compound, recovery from etching damage is possible, in addition to which etching residues can be cleaned away and removed. The reason is thought to be as follows. Along with having the ability to clean away etching residues, the nitrogen-containing substance stabilizes silanol bonds that arise from the silicon-containing compound. These silanol bonds undergo dehydration/condensation reactions with hydrophilic groups on silanol groups at the silicon dielectric film surface that has incurred damage from etching, as a result of which the adsorption of water by hydrophilic groups at the surface of the silicon dielectric film can be suppressed.

The rise in the dielectric constant of a silicon dielectric film in etching is thought to occur both because the silicon dielectric film incurs damage of some sort from etching, causing the surface to become hydrophilic, and also because of the presence of etching residues. The post-etch treatment agent of the present embodiment can be used to overcome both of these problems. The presence of etching residues can give rise to problems such as a deterioration in adhesion between the silicon dielectric film and an overlying layer, film separation, and wiring metal migration due to insufficient barrier function by the barrier metal—which is thought to be caused by uneven film thickness of the layer overlying the silicon dielectric film, all of which can also be resolved using the post-etch treatment agent of the present embodiment. That is, the post-etch treatment agent of the embodiment can be used both for recovery from etching damage, and for cleaning away etching residues.

The word "treatment" in the post-etch treatment agent of the embodiment means to bring the inventive post-etch treatment agent into contact with the surface of a silicon dielectric film that has been subjected to etching treatment. In the context of the present embodiment, "etching" encompasses both dry etching and wet etching. In the case of dry etching, the etching process is often accompanied by an ashing step and a cleaning step. Hence, in the case of dry etching, the "treatment" in connection with the inventive post-etch treatment agent may be carried out subsequent to the ashing step or may be carried out as also the cleaning step. Whether the etching process used is dry etching or wet etching, other stages of these processes may be carried out as appropriate.

The semiconductor device of the embodiment is not subject to any particular limitation. The inventive post-etch treatment agent may be employed in known semiconductor devices.

The silicon dielectric film is typically a dielectric film in a semiconductor device, but is not particularly limited in this regard. As used herein, "dielectric film in a semiconductor device" refers to a dielectric film in an intermediate product stage during the manufacture of a semiconductor device. Such a dielectric film is typically a dielectric film that serves as a wiring layer substrate, although it may be any dielectric film which is used in a semiconductor device and incurs etching treatment. When the dielectric film is a wiring layer substrate, "etching" denotes the formation of trenches such as wiring trenches or the formation of holes such as vias (via holes). The dielectric film may include also features other than the above. In the description that follows, for the sake of simplicity, the phrase "trenches and the like" is sometimes used in the sense of "trenches or holes or both trenches and holes."

Although the silicon dielectric film of the embodiment may be used in any application, to address in particular the trend toward higher signal transmission and reception speeds in large-scale integration (LSI) devices, it is preferably used in dielectric film applications for burying wiring and vias.

As used herein, "silicon dielectric film" refers to a dielectric film made of a material composed primarily of silicon and oxygen (also referred to as a "SiO-containing material"), a material composed primarily of silicon, oxygen and carbon (also referred to as a "SiOC-containing material"), a material composed primarily of silicon, oxygen, carbon and hydrogen (also referred to as a "SiOCH-containing material"), a material composed primarily of silicon, oxygen, carbon and nitrogen (also referred to as a "SiOCN-containing material"), or a material composed primarily of silicon, oxygen, carbon, nitrogen and hydrogen (also referred to as a "SiOCHN-containing material"). These silicon-based dielectric materials which make up the silicon dielectric film of the embodiment may be suitably selected from among known SiO-containing materials, SiOC-containing materials, SiOCH-containing materials, SiOCN-containing materials and SiOCHN-containing materials. As used above, the phrase "composed primarily of" means that other ingredients may also be present, provided the function as a dielectric film is not compromised. Films made of these materials are sometimes referred to accordingly; e.g., films made of SiOCH-containing materials are sometimes referred to herein as "SiOCH films."

Silicon dielectric films made of SiO-containing materials may also be referred to as "$SiO_2$-type silicon dielectric films," and are exemplified by films having an atomic compositional ratio close to that of $SiO_2$. Illustrative examples of such compositions include nanoclustering silica (NCS; specific dielectric constant, 2.25) formed by spin coating, and porous carbon-doped $SiO_2$ films (specific dielectric constant, about 2.5 to 3.0) obtained by adding a thermally decomposable compound to a carbon-doped $SiO_2$ film formed by chemical vapor deposition (CVD) so as to render the film porous.

Exemplary SiOC-containing material and the SiOCH-containing material include known materials of this type prepared from, as the starting material, a polycarbosilane containing silicon and carbon on the main chain or a polycarboxysilane containing also oxygen on the main chain, and materials of this type prepared from other suitable starting materials. In addition, SiOC-containing materials, such as the above-mentioned carbon-doped $SiO_2$ (specific dielectric constant, about 3.3 to 3.5) formed by CVD, and organic SOG and inorganic SOG (specific dielectric constant, about 2.7 to 3.3) formed by spin coating; and SiOCH-containing materials such as SiOCH films (specific dielectric constant, about 4.2 to 4.5) formed by CVD are also known.

Examples of SiOCN-containing materials and SiOCHN-containing materials include SiOCHN-containing materials formed by CVD.

From the standpoint of the low dielectric constant, it is preferable for the silicon dielectric film obtained from these silicon dielectric film-forming materials to have a specific dielectric constant of 2.7 or below. In order to achieve a lower dielectric constant, these materials often have numerous pores with diameters of from several nanometers to about 10 nm.

From the standpoint of interactions with moisture, when a SiOC-containing material, a SiOCH-containing material or a SiOCHN-containing material is used, SiOH groups readily arise, which makes employing the present embodiment even more preferable. It is especially desirable to employ the present embodiment in cases where the silicon dielectric film includes a SiOCH-containing material.

The nitrogen-containing substance of the embodiment is selected from the group consisting of ammonium bases and amine compounds. The nitrogen-containing substance may be a single substance, a mixture of a plurality of substances of a single type, or a mixture of a plurality of substances of a plurality of types. That is, the nitrogen-containing substance may be ammonium base alone, an amine compound alone, or a mixture of ammonium base with an amine compound.

The ammonium base of the embodiment includes, other than ammonia, ammonium bases in the form of ammonium ions. Illustrative examples include $NH^{4+}$, and ions in which some or all of the hydrogens on $NH^{4+}$ are substituted with any group selected from the group consisting of aliphatic groups which may include substituents and may be alicyclic groups, and aromatic groups which may include substituents. Quaternary ammonium ions are also typically included.

Illustrative examples of the ammonium base include ammonia, tetrapropylammonium hydroxide, tetra-n-butylammonium hydroxide and tetramethylammonium hydroxide.

The amine compound of the embodiment includes primary to tertiary amines, in which the groups that bond with the nitrogen may be suitably selected from the group consisting of hydrogens, aliphatic groups which may include substituents and may be alicyclic groups, and aromatic groups which may include substituents. The amine compound may be suitably selected from among known types of amine compounds. A plurality of amino groups may be present in a single compound. Illustrative examples of such amine compounds include methylamine, trimethylamine, aniline, ethylenediamine, guanidine, triethylamine, diethylamine, N—N-diisopropylethylamine, trimethylamine, hexamethylenediamine and tetramethylethylenediamine.

The acid of the embodiment, in combination with the nitrogen-containing substance of the embodiment, exerts a buffering action on the inventive post-etch treatment agent. Such an acid may be suitably selected from among known acids. Illustrative examples of the acid according to the embodiment include hydrochloric acid, sulfuric acid, nitric acid, hypochlorous acid, chloric acid, permanganic acid, acetic acid, hydrofluoric acid, phosphoric acid, citric acid, sulfamic acid, oxalic acid, formic acid, tartaric acid and glycolic acid. When these acids are reacted with the ammonium base according to the embodiment, they form, for example, ammonium chloride, ammonium sulfate, ammonium nitrate, ammonium carbonate, ammonium hypochlorite, ammonium chlorate, ammonium permanganate, ammonium acetate, ammonium fluoride, dibasic ammonium phosphate, diammonium citrate, triammonium citrate, ammonium sulfamate, ammonium oxalate, ammonium formate, ammonium tartrate, ammonium bitartrate and ammonium glycolate.

From the standpoint of the water solubility of the nitrogen-containing substance according to the embodiment, it is preferable that the reaction of the acid with the nitrogen-containing substance of the embodiment result in neutrality or a weak base. A weak base is more preferable. The weak base may even be a base with a pH of substantially 7, although a base having a pH in a range greater than 7 and up to 10 is more preferred. From the standpoint of electrolytic dissociation to ions, a strong acid such as hydrofluoric acid, phosphoric acid or formic acid is preferred. To discourage corrosion of the wiring metal, the acid may even be an organic acid or an acid to which a corrosion inhibitor has been optionally added. However, the imparting of a buffering effect is not itself a feature of the present embodiment.

From the standpoint of the buffering effect, when the nitrogen-containing substance and the acid are brought together, the equivalent ratio of the nitrogen-containing substance which does not incur the acid-base reaction and remains unreacted to the salt that forms from the reaction is preferably in a range of from 1:0.001 to 1:1,000.

In this embodiment, "the nitrogen-containing substance and the acid" need not be arrived at by adding a nitrogen-containing substance and an acid; it suffices for the composition of the post-etch treatment agent to be the same as the composition that would arise from adding a nitrogen-containing substance and an acid. Thus, for example, ammonium water and ammonium chloride may be used.

The silicon-containing compound of the embodiment contains at least one type of compound containing silicon, carbon and hydrogen. In addition to silicon, carbon and hydrogen, the compound may include also chlorine and nitrogen. The compound may include also other elements, so long as the dielectric constant rise-suppressing effect of the embodiment can be achieved.

The silicon-containing compound of the embodiment may be suitably selected from among known compounds which satisfy the above conditions, although the inclusion of a compound selected from the group consisting of compounds of formulas (1) to (3) below is preferred.

[C 10]

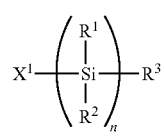

(1)

[C 11]

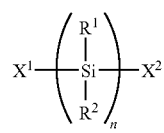

(2)

[C 12]

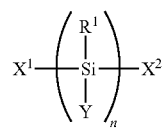

(3)

In above formulas (1) to (3), $R^1$, $R^2$ and $R^3$ are each independently a hydrogen, an aliphatic hydrocarbon of 1 to 4 carbons, or an aromatic hydrocarbon of 6 to 8 carbons which may include a substituent. $X^1$ and $X^2$ are each independently a chloro group, a hydroxyl group or an alkoxy group of 1 to 3 carbons. Y is in one occurrence, independently of other occurrences of Y and independently also of $X^1$ and $X^2$, a chloro group, a hydroxyl group or an alkoxy group of 1 to 3 carbons. If there are two or more occurrences of Y, each additional occurrence of Y is, independently of other occurrences of Y and independently also of $R^1$ and $R^2$, a hydrogen, an aliphatic hydrocarbon of 1 to 4 carbons or an aromatic hydrocarbon of 6 to 8 carbons which may include a substituent. Each letter n is independently an integer from 1 to 3. The aliphatic hydrocarbon encompasses also alicyclic groups.

Illustrative examples include chlorosilane, dichlorosilane, trichlorosilane, trimethylchlorosilane, dimethylchlorosilane, dimethyldichlorosilane, methylchlorosilane, methyltrichlorosilane, triethylchlorosilane, diethylchlorosilane, diethyldichlorosilane, ethylchlorosilane, ethyltrichlorosilane, ethylmethylchlorosilane, ethylmethyldichlorosilane, ethyldimethylchlorosilane, methyldiethylchlorosilane, phenylchlorosilane, diphenylchlorosilane, triphenylchlorosilane, phenyldichlorosilane, phenyltrichlorosilane, diphenyldichlorosilane, phenylmethylchlorosilane, phenylmethyldichlorosilane, phenyldimethylchlorosilane, phenyldiethylchlorosilane, diphenylmethylchlorosilane, diphenylethylchlorosilane, phenylethylmethylchlorosilane, vinylchlorosilane, vinyldichlorosilane, vinyltrichlorosilane, divinylchlorosilane, divinyldichlorosilane, trivinylchlorosilane, vinylmethylchlorosilane, vinylethylchlorosilane, vinylmethyldichlorosilane, vinylethyldichlorosilane, propylchlorosilane, propyldichlorosilane, propyltrichlorosilane, dipropylchlorosilane, dipropylchlorosilane, dipropyldichlorosilane, tripropylchlorosilane, propylmethylchlorosilane, propylethylchlorosilane, propylphenylchlorosilane, propylvinylchlorosilane, propylmethyldichlorosilane, propylethyldichlorosilane, propylphenyldichlorosilane, propylvinyldichlorosilane, propyldimethylchlorosilane, propyldiethylchlorosilane, propyldiphenylchlorosilane, propyldivinylchlorosilane, dipropylmethylchlorosilane, dipropylethylchlorosilane, dipropylphenylchlorosilane, dipropylvinylchlorosilane, propylmethylethylchlorosilane, propylethylphenylchlorosilane, propylmethylphenylchlorosilane, propylmethylvinylchlorosilane, propylethylvinylchlorosilane, propylphenylvinylchlorosilane, butylchlorosilane, dibutylchlorosilane, dibutyldichlorosilane, tributylchlorosilane, butyltrichlorosilane, butylmethylchlorosilane, butylethylchlorosilane, butylphenylchlorosilane, butylvinylchlorosilane, butylpropylchlorosilane, butylmethyldichlorosilane, butylethyldichlorosilane, butylphenyldichlorosilane, butylvinyldichlorosilane, butylpropyldichlorosilane, butyldimethylchlorosilane, butyldiethylchlorosilane, butyldiphenylchlorosilane, butyldivinylchlorosilane, butyldipropylchlorosilane, dibutylmethylchlorosilane, dibutylethylchlorosilane, dibutylphenylchlorosilane, dibutylvinylchlorosilane, dibutylpropylchlorosilane, butylmethylethylchlorosilane, butylmethylphenylchlorosilane, butylethylphenylchlorosilane, butylmethylvinylchlorosilane, butylethylvinylchlorosilane, butylphenylvinylchlorosilane, butylmethylpropylchlorosilane, butylethylpropylchlorosilane, butylphenylpropylchlorosilane, butylvinylpropylchlorosilane, p-tolylchlorosilane, p-tolyldichlorosilane, p-tolyltrichlorosilane, p-tolyldimethylchlorosilane, p-tolylmethyldichlorosilane, p-tolylphenylchlorosilane, p-tolyldiphenylchlorosilane, p-tolylphenyldichlorosilane, 1-ethyl-4-chlorosilylbenzene, 1-ethyl-4-dimethylchlorosilylbenzene, 1-ethyl-4-methyldichlorosilylbenzene, 1-ethyl-4-trichlorosilylbenzene, 1-ethyl-4-phenylchlorosilylbenzene, 1-ethyl-4-diphenylchlorosilylbenzene, 1-ethyl-4-phenyldichlorosilylbenzene, 2,6-dimethyl-4-chlorosilylbenzene, 2,6-dimethyl-4-dichlorosilylbenzene, 2,6-dimethyl-4-trichlorosilylbenzene, 2,6-dimethyl-4-methylchlorosilylbenzene, 2,6-dimethyl-4-methyldichlorosilylbenzene, 2,6-dimethyl-4-dimethylchlorosilylbenzene, 2,6-dimethyl-4-phenylchlorosilylbenzene, 2,6-dimethyl-4-phenyldichlorosilylbenzene, 2,6-dimethyl-4-diphenylchlorosilylbenzene, tribenzylchlorosilane, dibenzylchlorosilane, dibenzyldichlorosilane, benzyltrichlorosilane, pentafluorophenyldimethylchlorosilane, pentafluorophenylmethyldichlorosilane, 3-morpholinopropyltrichlorosilane, 3-morpholinopropyldimethylchlorosilane, p-methoxyphenyltrichlorosilane, p-methoxyphenyldimethylchlorosilane, isopropyldimethylchlorosilane, isopropylmethyldichlorosilane, isobutyltrichlorosilane, isobutyldimethylchlorosilane, isobutylmethyldichlorosilane, trichlorosilylanilide, 4-[2-(trichlorosilyl)ethyl]pyridine, 2-[2-(trichlorosilyl)ethyl]pyridine, N-(3-trichlorosilylpropyl)-4,5-dihydroimidazole, 3-(trichlorosilyl)cyclopentene, silanol, disilanol, trisilanol, trimethylsilanol, dimethylsilanol, dimethyldisilanol, methylsilanol, methyltrisilanol, triethylsilanol, diethylsilanol, diethyldisilanol, ethylsilanol, ethyltrisilanol, ethylmethylsilanol, ethylmethyldisilanol, ethyldimethylsilanol, methyldiethylsilanol, phenylsilanol, diphenylsilanol, triphenylsilanol, phenyldisilanol, phenyltrisilanol, diphenyldisilanol, phenylmethylsilanol, phenylmethyldisilanol, phenyldimethylsilanol, phenyldiethylsilanol, diphenylmethylsilanol, diphenylethylsianol, phenylethylmethylsilanol, vinylsilanol, vinyldisilanol, vinyltrisilanol, divinylsilanol, divinyldisilanol, trivinylsilanol, vinylmethylsilanol, vinylethylsilanol, vinylmethyldisilanol, vinylethyldisilanol, propylsilanol, propyldisilanol, propyltrisilanol, dipropylsilanol, dipropylsilanol, dipropyldisilanol, tripropylsilanol, propylmethylsilanol, propylethylsilanol, propylphenylsilanol, propylvinylsilanol, propylmethyldisilanol, propylethyldisilanol, propylphenyldisilanol, propylvinyldisilanol, propyldimethylsilanol, propyldiethylsilanol, propyldiphenylsilanol, propyldivinylsilanol, dipropylmethylsilanol, dipropylethylsilanol, dipropylphenylsilanol, dipropylvinylsilanol, propylmethylethylsilanol, propylethylphenylsilanol, propylmethylphenylsilanol, propylmethylvinylsilanol, propylethylvinylsilanol, propylphenylvinylsilanol, butylsilanol, dibutylsilanol, dibutyldisilanol, tributylsilanol, butyltrisilanol, butylmethylsilanol, butylethylsilanol, butylphenylsilanol, butylvinylsilanol, butylpropylsilanol, butylmethyldisilanol, butylethyldisilanol, butylphenyldisilanol, butylvinyldisilanol, butylpropyldisilanol, butyldimethylsilanol, butyldiethylsilanol, butyldiphenylsilanol, butyldivinylsilanol, butyldipropylsilanol, dibutylmethylsilanol, dibutylethylsilanol, dibutylphenylsilanol, dibutylvinylsilanol, dibutylpropylsilanol, butylmethylethylsilanol, butylmethylphenylsilanol, butylethylphenylsilanol, butylmethylvinylsilanol, butylethylvinylsilanol, butylphenylvinylsilanol, butylmethylpropylsilanol, butylethylpropylsilanol, butylphenylpropylsilanol, butylvinylpropylsilanol, p-tolylsilanol, p-tolyldisilanol, p-tolyltrisilanol, p-tolyldimethylsilanol, p-tolylmethyldisilanol, p-tolylphenylsilanol, p-tolyldiphenylsilanol, p-tolylphenyldisilanol, 1-ethyl-4-hydroxysilylbenzene, 1-ethyl-4-dimethylhydroxysilylbenzene, 1-ethyl-4-methyldihydroxysilylbenzene, 1-ethyl-4-trihydroxysilylbenzene, 1-ethyl-4-phenylhydroxysilylbenzene, 1-ethyl-4-diphenylhydroxysilylbenzene, 1-ethyl-4-phenyldihydroxysilylbenzene, 2,6-dimethyl-4-hydroxysilylbenzene, 2,6-dimethyl-4-dihydroxysilylbenzene, 2,6-dimethyl-4-trihydroxysilylbenzene, 2,6-dimethyl-4-methylhydroxysilylbenzene, 2,6-dimethyl-4-methyldihydroxysilylbenzene, 2,6-dimethyl-4-dimethylhydroxysilylbenzene, 2,6-dimethyl-4-phenylhydroxysilylbenzene, 2,6-dimethyl-4-phenyldihydroxysilylbenzene, 2,6-dimethyl-4-diphenylhydroxysilylbenzene, tribenzylsilanol, dibenzylsilanol, dibenzyldisilanol, benzyltrisilanol, pentafluorophenyldimethylsilanol, pentafluorophenylmethyldisilanol, 3-morpholinopropyltrisilanol, 3-morpholinopropyldimethylsilanol, p-methoxyphenyltrisilanol, p-methoxyphenyldimethylsilanol, isopropyldimethylsilanol, isopropylmethyldisilanol, isobutyltrisilanol, isobutyldimethylsilanol, isobutylmethyldisilanol, trihydroxysilylanilide, 4-[2-(trihydroxysilyl)ethyl]pyridine, 2-[2-(trihydroxysilyl)ethyl]pyridine, N-(3-trihydroxysilylpropyl)-4,5-dihydroimidazole, 3-(trihydroxysilyl)cyclopentene, methoxysilane, dimethoxysilane, trimethoxysilane, trimethylmethoxysilane, dimethylmethoxysilane, dimethyldimethoxysilane, methylmethoxysilane, methyltrimethoxysilane, triethylmethoxysilane, diethylmethoxysilane, diethyldimethoxysilane, ethylmethoxysilane, ethyltrimethoxysilane, ethylmethylmethoxysilane, ethylmethyldimethoxysilane, ethyldimethylmethoxysilane, methyldiethylmethoxysilane, phenylmethoxysilane, diphenylmethoxysilane, triphenylmethoxysilane, phenyldimethoxysilane, phenyltrimethoxysilane, diphenyldimethoxysilane, phenylmethylmethoxysilane, phenylmethyldimethoxysilane, phenyldimethylmethoxysilane, phenyldiethylmethoxysilane, diphenylmethylmethoxysilane, diphenylethylmethoxysilane, phenylethylmethylmethoxysilane, vinylmethoxysilane, vinyldimethoxysilane, vinyltrimethoxysilane, divinylmethoxysilane, divinyldimethoxysilane, trivinylmethoxysilane, vinylmethylmethoxysilane, vinylethylmethoxysilane, vinylmethyldimethoxysilane, vinylethyldimethoxysilane, propylmethoxysilane, propyldimethoxysilane, propyltrimethoxysilane, dipropylmethoxysilane, dipropylmethoxysilane, dipropyldimethoxysilane, tripropylmethoxysilane, propylmethylmethoxysilane, propylethylmethoxysilane, propylphenylmethoxysilane, propylvinylmethoxysilane, propylmethyldimethoxysilane, propylethyldimethoxysilane, propylphenyldimethoxysilane, propylvinyldimethoxysilane, propyldimethylmethoxysilane, propyldiethylmethoxysilane, propyldiphenylmethoxysilane, propyldivinylmethoxysilane, dipropylmethylmethoxysilane, dipropylethylmethoxysilane, dipropylphenylmethoxysilane, dipropylvinylmethoxysilane, propylmethylethylmethoxysilane, propylethylphenylmethoxysilane, propylmethylphenylmethoxysilane, propylmethylvinylmethoxysilane, propylethylvinylmethoxysilane, propylphenylvinylmethoxysilane, butylmethoxysilane, dibutylmethoxysilane, dibutyldimethoxysilane, tributylmethoxysilane, butyltrimethoxysilane, butylmethylmethoxysilane, butylethylmethoxysilane, butylphenylmethoxysilane, butylvinylmethoxysilane, butylpropylmethoxysilane, butylmethyldimethoxysilane, butylethyldimethoxysilane, butylphenyldimethoxysilane, butylvinyldimethoxysilane, butylpropyldimethoxysilane, butyldimethylmethoxysilane, butyldiethylmethoxysilane, butyldiphenylmethoxysilane, butyldivinylmethoxysilane, butyldipropylmethoxysilane, dibutylmethylmethoxysilane, dibutylethylmethoxysilane, dibutylphenylmethoxysilane, dibutylvinylmethoxysilane, dibutylpropylmethoxysilane, butylmethylethylmethoxysilane, butylmethylphenylmethoxysilane, butylethylphenylmethoxysilane, butylmethylvinylmethoxysilane, butylethylvinylmethoxysilane, butylphenylvinylmethoxysilane, butylmethylpropylmethoxysilane, butylethylpropylmethoxysilane, butylphenylpropylmethoxysilane, butylvinylpropylmethoxysilane, p-tolylmethoxysilane, p-tolyldimethoxysilane, p-tolyltrimethoxysilane, p-tolyldimethylmethoxysilane, p-tolylmethyldimethoxysilane, p-tolylphenylmethoxysilane, p-tolyldiphenylmethoxysilane, p-tolylphenyldimethoxysilane, 1-ethyl-4-methoxysilylbenzene, 1-ethyl-4-dimethylmethoxysilylbenzene, 1-ethyl-4-methyldimethoxysilylbenzene, 1-ethyl-4-trimethoxysilylbenzene, 1-ethyl-4-phenylmethoxysilylbenzene, 1-ethyl-4-diphenylmethoxysilylbenzene, 1-ethyl-4-phenyldimethoxysilylbenzene, 2,6-dimethyl-4-methoxysilylbenzene, 2,6-dimethyl-4-dimethoxysilylbenzene, 2,6-dimethyl-4-trimethoxysilylbenzene, 2,6-dimethyl-4-methylmethoxysilylbenzene, 2,6-dimethyl-4-methyldimethoxysilylbenzene, 2,6-dimethyl-4-dimethylmethoxysilylbenzene, 2,6-dimethyl-4-phenylmethoxysilylbenzene, 2,6-dimethyl-4-phenyldimethoxysilylbenzene, 2,6-dimethyl-4-diphenylmethoxysilylbenzene, tribenzylmethoxysilane, dibenzylmethoxysilane, dibenzyldimethoxysilane, benzyltrimethoxysilane, pentafluorophenyldimethylmethoxysilane, pentafluorophenylmethyldimethoxysilane, 3-morpholinopropyltrimethoxysilane, 3-morpholinopropyldimethylmethoxysilane, p-methoxyphenyltrimethoxysilane, p-methoxyphenyldimethylmethoxysilane, isopropyldimethylmethoxysilane, isopropyltrimethoxysilane, isobutyltrimethoxysilane, isobutyldimethylmethoxysilane, isobutylmethyldimethoxysilane, trimethoxysilylanilide, 4-[2-(trimethoxysilyl)ethyl]pyridine, 2-[2(trimethoxysilyl)ethyl]pyridine, N-(3-trimethoxysilylpropyl)-4,5-dihydroimidazole, 3-(trimethoxysilyl)cyclopentene, ethoxysilane, diethoxysilane, triethoxysilane, trimethylethoxysilane, dimethylethoxysilane, dimethyldiethoxysilane, methylethoxysilane, methyltriethoxysilane, triethylethoxysilane, diethylethoxysilane, diethyldiethoxysilane, ethylethoxysilane, ethyltriethoxysilane, ethylmethylethoxysilane, ethylmethyldiethoxysilane, ethyldimethylethoxysilane, methyldiethylethoxysilane, phenylethoxysilane, diphenylethoxysilane, triphenylethoxysilane, phenyldiethoxysilane, phenyltriethoxysilane, diphenyldiethoxysilane, phenylmethylethoxysilane, phenylmethyldiethoxysilane, phenyldimethylethoxysilane, phenyldiethylethoxysilane, diphenylmethylethoxysilane, diphenylethylethoxysilane, phenylethylmethylethoxysilane, vinylethoxysilane, vinyldiethoxysilane, vinyltriethoxysilane, divinylethoxysilane, divinyldiethoxysilane, trivinylethoxysilane, vinylmethylethoxysilane, vinylethylethoxysilane, vinylmethyldiethoxysilane, vinylethyldiethoxysilane, propylethoxysilane, propyldiethoxysilane, propyltriethoxysilane, dipropylethoxysilane, dipropylethoxysilane, dipropyldiethoxysilane, tripropylethoxysilane, propylmethylethoxysilane, propylethylethoxysilane, propylphenylethoxysilane, propylvinylethoxysilane, propylmethyldiethoxysilane, propylethyldiethoxysilane, propylphenyldiethoxysilane, propylvinyldiethoxysilane, propyldimethylethoxysilane, propyldiethylethoxysilane, propyldiphenylethoxysilane, propyldivinylethoxysilane, dipropylmethylethoxysilane, dipropylethylethoxysilane, dipropylphenylethoxysilane, dipropylvinylethoxysilane, propylmethylethylethoxysilane, propylethylphenylethoxysilane, propylmethylphenylethoxysilane, propylmethylvinylethoxysilane, propylethylvinylethoxysilane, propylphenylvinylethoxysilane, butylethoxysilane, dibutylethoxysilane, dibutyldiethoxysilane, tributylethoxysilane, butyltriethoxysilane, butylmethylethoxysilane, butylethylethoxysilane, butylphenylethoxysilane, butylvinylethoxysilane, butylpropylethoxysilane, butylmethyldiethoxysilane, butylethyldiethoxysilane, butylphenyldiethoxysilane, butylvinyldiethoxysilane, butylpropyldiethoxysilane, butyldimethylethoxysilane, butyldiethylethoxysilane, butyldiphenylethoxysilane, butyldivinylethyloxysilane, butyldipropylethoxysilane, dibutylmethylethoxysilane, dibutylethylethoxysilane, dibutylphenylethoxysilane, dibutylvinylethoxysilane, dibutylpropylethoxysilane, butylmethylethylethoxysilane, butylmethylphenylethoxysilane, butylethylphenylethoxysilane, butylmethylvinylethoxysilane, butylethylvinylethoxysilane, butylphenylvinylethoxysilane, butylmethylpropylethoxysilane, butylethylpropylethoxysilane, butylphenylpropylethoxysilane, butylvinylpropylethoxysilane, p-tolylethoxysilane, p-tolyldiethoxysilane, p-tolyltriethoxysilane, p-tolyldimethylethoxysilane, p-tolylmethyldiethoxysilane, p-tolylphenylethoxysilane, p-tolyldiphenylethoxysilane, p-tolylphenyldiethoxysilane, 1-ethyl-4-ethoxysilylbenzene, 1-ethyl-4-dimethylethoxysilylbenzene, 1-ethyl-4-methyldiethoxysilylbenzene, 1-ethyl-4-triethoxysilylbenzene, 1-ethyl-4-phenylethoxysilylbenzene, 1-ethyl-4-diphenylethoxysilylbenzene, 1-ethyl-4-phenyldiethoxysilylbenzene, 2,6-dimethyl-4-ethoxysilylbenzene, 2,6-dimethyl-4-diethoxysilylbenzene, 2,6-dimethyl-4-triethoxysilylbenzene, 2,6-dimethyl-4-methylethoxysilylbenzene, 2,6-dimethyl-4- methyldiethoxysilylbenzene, 2,6-dimethyl-4-dimethylethoxysilylbenzene, 2,6-dimethyl-4-phenylethoxysilylbenzene, 2,6-dimethyl-4-phenyldiethoxysilylbenzene, 2,6-dimethyl-4-diphenylethoxysilylbenzene, tribenzylethoxysilane, dibenzylethoxysilane, dibenzyldiethoxysilane, benzyltriethoxysilane, pentafluorophenyldimethylethoxysilane, pentafluorophenylmethyldiethoxysilane, 3-morpholinopropyltriethoxysilane, 3-morpholinopropyldimethylethoxy, p-methoxyphenyltriethoxysilane, p-methoxyphenyldimethylethoxysilane, isopropyldimethylethoxysilane, isopropylmethyldiethoxysilane, isobutyltriethoxysilane, isobutyldimethylethoxysilane, isobutylmethyldiethoxysilane, trichlorosilylethoxyanilide, 4-[2-(trichlorosilyl)ethyl]pyridine, 2-[2-(triethoxysilyl)ethyl]pyridine, N-(3-triethoxysilylpropyl)-4,5-dihydroimidazole, 3-(trichlorosilyl)diethoxypentene, propoxysilane, dipropoxysilane, tripropoxysilane, trimethylpropoxysilane, dimethylpropoxysilane, dimethyldipropoxysilane, methylpropoxysilane, methyltripropoxysilane, triethylpropoxysilane, diethylpropoxysilane, diethyldipropoxysilane, ethylpropoxysilane, ethyltripropoxysilane, ethylmethylpropoxysilane, ethylmethyldipropoxysilane, ethyldimethylpropoxysilane, methyldiethylpropoxysilane, phenylpropoxysilane, diphenylpropoxysilane, triphenylpropoxysilane, phenyldipropoxysilane, phenyltripropoxysilane, diphenyldipropoxysilane, phenylmethylpropoxysilane, phenylmethyldipropoxysilane, phenyldimethylpropoxysilane, phenyldiethylpropoxysilane, diphenylmethylpropoxysilane, diphenylethylpropoxysilane, phenylethylmethylpropoxysilane, vinylpropoxysilane, vinyldipropoxysilane, vinyltripropoxysilane, divinylpropoxysilane, divinyldipropoxysilane, trivinylpropoxysilane, vinylmethylpropoxysilane, vinylethylpropoxysilane, vinylmethyldipropoxysilane, vinylethyldipropoxysilane, propylpropoxysilane, propyldipropoxysilane, propyltripropoxysilane, dipropylpropoxysilane, dipropylpropoxysilane, dipropyldipropoxysilane, tripropylpropoxysilane, propylmethylpropoxysilane, propylethylpropoxysilane, propylphenylpropoxysilane, propylvinylpropoxysilane, propylmethyldipropoxysilane, propylethyldipropoxysilane, propylphenyldipropoxysilane, propylvinyldipropoxysilane, propyldimethylpropoxysilane, propyldiethylpropoxysilane, propyldiphenylpropoxysilane, propyldivinylpropoxysilane, dipropylmethylpropoxysilane, dipropylethylpropoxysilane, dipropylphenylpropoxysilane, dipropylvinylpropoxysilane, propylmethylethylpropoxysilane, propylethylphenylpropoxysilane, propylmethylphenylpropoxysilane, propylmethylvinylpropoxysilane, propylethylvinylpropoxysilane, propylphenylvinylpropoxysilane, butylpropoxysilane, dibutylpropoxysilane, dibutyldipropoxysilane, tributylpropoxysilane, butyltripropoxysilane, butylmethylpropoxysilane, butylethylpropoxysilane, butylphenylpropoxysilane, butylvinylpropoxysilane, butylpropylpropoxysilane, butylmethyldipropoxysilane, butylethyldipropoxysilane, butylphenyldipropoxysilane, butylvinyldipropoxysilane, butylpropyldipropoxysilane, butyldimethylpropoxysilane, butyldiethylpropoxysilane, butyldiphenylpropoxysilane, butyldivinylpropoxysilane, butyldipropylpropoxysilane, dibutylmethylpropoxysilane, dibutylethylpropoxysilane, dibutylphenylpropoxysilane, dibutylvinylproxysilane, dibutylpropylpropoxysilane, butylmethylethylpropoxysilane, butylmethylphenylpropoxysilane, butylethylphenylpropoxysilane, butylmethylvinylpropoxysilane, butylethylvinylpropoxysilane, butylphenylvinylpropoxysilane, butylmethylpropylpropoxysilane, butylethylpropylpropoxysilane, butylphenylpropylpropoxysilane, butylvinylpropylpropoxysilane, p-tolylpropoxysilane, p-tolyldipropoxysilane, p-tolyltripropoxysilane, p-tolyldimethylpropoxysilane, p-tolylmethyldipropoxysilane, p-tolylphenylpropoxysilane, p-tolyldiphenylpropoxysilane, p-tolylphenyldipropoxysilane, 1-ethyl-4-propoxysilylbenzene, 1-ethyl-4-dimethylpropoxysilylbenzene, 1-ethyl-4-methyldipropoxysilylbenzene, 1-ethyl-4-tripropoxysilylbenzene, 1-ethyl-4-phenylpropoxysilylbenzene, 1-ethyl-4-diphenylpropoxysilylbenzene, 1-ethyl-4-phenyldipropoxysilylbenzene, 2,6-dimethyl-4-propoxysilylbenzene, 2,6-dimethyl-4-dipropoxysilylbenzene, 2,6-dimethyl-4-tripropoxysilylbenzene, 2,6-dimethyl-4-methylpropoxysilylbenzene, 2,6-dimethyl-4-methyldipropoxysilylbenzene, 2,6-dimethyl-4-dimethylpropoxysilylbenzene, 2,6-dimethyl-4-phenylpropoxysilylbenzene, 2,6-dimethyl-4-phenyldipropoxysilylbenzene, 2,6-dimethyl-4-diphenylpropoxysilylbenzene, tribenzylpropoxysilane, dibenzylpropoxysilane, dibenzyldipropoxysilane, benzyltripropoxysilane, pentafluorophenyldimethylpropoxysilane, pentafluorophenylmethyldipropoxysilane, 3-morpholinopropyltripropoxysilane, 3-morpholinopropyldimethylpropoxysilane, p-methoxyphenyltripropoxysilane, p-methoxyphenyldimethylpropoxysilane, isopropyldimethylpropoxysilane, isopropylmethyldipropoxysilane, isobutyltripropoxysilane, isobutyldimethylpropoxysilane, isobutylmethyldipropoxysilane, tripropoxysilanilide, 4-[2-(tripropoxysilyl)ethyl]pyridine, 2-[2-(tripropoxysilyl)ethyl]pyridine, N-(3-tripropoxysilylpropyl)-4,5-dhydroimidazole and 3-(tripropoxysilyl)cyclopentene.

Alternatively, the silicon-containing compound of the embodiment preferably includes a compound obtained by removing at least one of the chloro group, hydroxyl group and alkoxy group of 1 to 3 carbons among the $X^1$, $X^2$ and Y moieties in a compound selected from the group consisting of compounds of formulas (1) to (3), and bonding together molecules thereof through nitrogen. Such bonds through nitrogen are called silazane bonds.

The compound having such a silazane bond includes also compounds which have two groups of one to three silicons and are obtained by removing one of the chloro group, hydroxyl group and alkoxy group of 1 to 3 carbons among the $X^1$, $X^2$ and Y moieties in a compound selected from the group consisting of compounds of formulas (1) to (3), and bonding together molecules thereof through nitrogen; and compounds which have three or more groups of one to three silicons and are obtained by (A) removing any one or more chloro group, hydroxyl group or alkoxy group of 1 to 3 carbons among the $X^1$, $X^2$ and Y moieties in a compound selected from the group consisting of compounds of formulas (1) to (3), (B) removing any one or two or more chloro group, hydroxyl group or alkoxy group of 1 to 3 carbons among the $X^1$, $X^2$ and Y moieties in a compound selected from the group consisting of compounds of formulas (1) to (3), and bonding together (A) and (B) through nitrogen. Examples of such compounds are depicted in FIG. 6.

The function of the silicon-containing compound of the embodiment is to repair damage caused by etching, and thereby suppress deterioration of the dielectric constant. The function of the nitrogen-containing substance of the embodiment presumably is to efficiently clean away etching residues and also, apparently, to buffer the pH so as to optimize the damage-recovering function (or the dielectric constant deterioration-suppressing function) of the silicon-containing compound of the embodiment. From the standpoint of the pH buffering function, it is preferable for the post-etching treatment agent of the embodiment to have a pH in a range greater than 7 and up to 10. However, the present embodiment is not limited by these functions, the essence of the embodiment residing in the ability to achieve the foregoing effects by a combination of the silicon-containing compound of the embodiment with the nitrogen-containing substance of the embodiment. The reason why the nitrogen-containing substance of the embodiment can efficiently clean away etching residues is presumably that the nitrogen-containing substance chemically decompose residues (e.g., fluorine-containing hydrocarbon compounds) which arise during etching. However, this mechanism is unrelated to the essence of the present embodiment.

Other substances, such as surfactants, may be included in the agent for post-etch treating silicon dielectric films, provided the objects of the embodiment are attainable.

The surfactant of the embodiment may be used for the purpose of enhancing the coating ability of the solution, i.e., the quality of the solution that enables it to be uniformly and smoothly coated, and may be suitably selected from among known surfactants. Examples of such surfactants include anionic surfactants, nonionic surfactants, cationic surfactants and amphoteric surfactants. Of these, nonionic surfactants are preferred. Illustrative examples of nonionic surfactants include alkylphenol-ethylene oxide surfactants, alcohol-ethylene oxide surfactants, propylene-ethylene oxide block copolymer surfactants, fatty acid ester surfactants, amide surfactants and polyethylene glycol surfactants. Of such nonionic surfactants, alcohol-ethylene oxide surfactants, alkylphenol-ethylene oxide surfactants and propylene-ethylene oxide block copolymer surfactants are preferred because they have been successfully used in the fabrication of semiconductor devices and provide a high reliability.

The above agents are added to a solvent to form a post-etch treatment agent of the embodiment. The solvent is not subject to any particular limitation, provided the agent is soluble therein. Illustrative examples of the solvent include water, methanol, ethanol, propanol, cyclohexanone, acetone, methyl isobutyl ketone, methyl ethyl ketone, methyl cellosolve, ethyl cellosolve, octane, decane, hexane, propylene glycol, propylene glycol monomethyl ether acetate, dioxane, diethyl ether, diethylene glycol, dimethyl sulfate, propylene glycol monomethyl ether, propylene glycol monoethyl ether, propylene glycol monopropyl ether, tetrahydrofuran, and mixtures thereof. Water or a mixture of water and an alcohol is especially preferred on account of the ease of handling.

Two or more each of the nitrogen-containing substance, the acid, the silicon-containing compound and the optional surfactant according to the embodiment may be included in the inventive post-etch treatment agent.

In the post-etch treatment agent of the embodiment, the respective concentrations of these materials are not subject to any particular limitation and may be suitably selected according to the actual circumstances. However, it is generally preferable for the nitrogen-containing substance to be included be in a range of from 0.01 to 10 wt %, the acid to be included in a range of from 0.01 to 10 wt %, the silicon-containing compound to be included in a range of 20 to 60 wt %, and the surfactant to be included in a range of from 1 to 10,000 ppm by weight. With regard to the nitrogen-containing substance and the acid, owing to interactions therebetween, it is often preferable to set the concentrations thereof based on, first and foremost, the pH of the post-etch treatment agent of the embodiment.

Within the above-indicated concentration ranges, to optimize the advantageous effects of the embodiment, it is preferable for the equivalent ratio of the total amount of the nitrogen-containing substance to the total amount of the acid in the post-etch treatment agent of the embodiment to be in a range of from 1:0.001 to 1:1,000. As used herein, "equivalent ratio" refers to the chemical equivalence between the acid, the base and the salt. By way of illustration, when the amount of ammonia (as the nitrogen-containing substance of the embodiment) is 1 mole and the amount of hydrochloric acid is 1 mole, the equivalent ratio is 1:1; but when the amount of ammonia is 1 mole and the amount of citric acid is 1 mole, the equivalent ratio is 1:3.

In cases where, as a result of etching, metal areas of the wiring, for example, are exposed, the post-etch treatment agent of the embodiment also has the advantage that it discourages corrosion of such metal areas. From this standpoint, it is especially preferable to maintain the pH in a range greater than 7 and up to 10.

[Method of Manufacturing Semiconductor Devices]

By manufacturing semiconductor devices using a method of manufacture that includes etching a silicon dielectric film in a semiconductor device, treating the etched surface with the post-etch treatment agent of the embodiment, and then carrying out heat-treatment at a temperature in a range of from 50 to 400° C., an etching-induced rise in the dielectric constant of the silicon dielectric film can be suppressed. Moreover, when a film has been formed on the surface after etching, peeling of the film and non-uniform film formation can be suppressed. As a result, it is possible to improve the quality of semiconductor devices, enabling semiconductor devices having a high speed and a high reliability to be achieved, in addition to which the manufacturing yield can be enhanced. Accordingly, the effects of the embodiment are especially large when the silicon dielectric film used has a specific dielectric constant of 2.7 or less.

The silicon dielectric film in this manufacturing method is preferably a dielectric film for insulating at least a wiring layer and/or vias in a semiconductor device. This type of dielectric film is often called an interlayer dielectric film. In the case of a wiring layer, it is common to form a barrier metal layer in a trench created by etching, and to embed an electrically conductive substance such as copper above the barrier metal layer. In such a case, a rise in the dielectric constant can be suppressed, the barrier metal layer can be made to adhere uniformly to the dielectric film, and migration of the wiring metal due to film separation or barrier metal failure can be prevented.

The post-etch treatment agent of the embodiment may be prepared in advance as the final composition, and this final composition used as appropriate. Alternatively, the starting materials and/or an intermediate composition may be combined just prior to use to give the final composition. To the extent that modification such as polymerization of the silicon-containing compound does not arise, the long-term preservation of the post-etch treatment agent of the embodiment is often possible.

The method of treating an etched surface with the post-etch treatment agent of the embodiment is not subject to any particular limitation, and may be suitably selected from among known methods. Illustrative examples of such methods includes dip coating in the post-etch treatment agent, spin coating, and spray coating. Any of these methods may be used in combination with ultrasonic oscillation.

In functional terms, this treatment may be used for recovery from damage due to etching, for cleaning away etching residues, or for obtaining both effects. In the manufacture of semiconductor devices, the step in which an etched surface is treated with the post-etch treatment agent of the embodiment may be incorporated at any stage of the manufacturing process, so long as the objects of the embodiment are attainable. However, in a process that already includes an etching damage recovery step or an etching residues cleaning step, it makes sense either to incorporate the step in which an etched surface is treated with the post-etch treatment agent of the embodiment into such a preexisting step or to incorporate it in place of such a step.

By treating the etched surface with the post-etch treatment agent, then carrying out heat treatment at a temperature in a range of from 50 to 400° C., recovery from damage can be achieved in a short time. Specifically, it appears to promote not only evaporation and removal of the solvent and the like but also dehydration/condensation of the hydrophilic groups who exists on the silicon dielectric film surface as silanol groups that has incurred damage from etching.

Heat treatment may be carried out by any method. Illustrative examples include heat treatment with a hot plate, in an oven or with an infrared lamp.

At a temperature below 50° C., little effect is achieved. On the other hand, at a temperature above 400° C., the possibility of deterioration of the silicon dielectric film arises. Heat treatment is carried out following treatment of the etched surface with the post-etch treatment agent. However, in cases where cleaning is to be carried out following treatment of the etched surface with the post-etch treatment agent so as to avoid the possibility of undesirable effects such as corrosion by the post-etch treatment agent, it is preferable to carry out heat treatment prior to such cleaning. The reason is because there is a large possibility that post-etch treatment agent remains, enabling dehydration/condensation to be carried out more effectively.

In some cases, heating may be carried out during treatment of the etched surface with the post-etch treatment agent. In such cases, the cleaning of etching residues can be promoted together with damage recovery. The temperature in such a case is preferably in a range of from 50 to 150° C. It is possible to use a combination of such heating with heating after treatment of the etched surface by the post-etch treatment agent, or to use only one of these heating steps.

EXAMPLES

Working examples of the embodiment and comparative examples are described below. The evaluation/test methods that were used are described after the descriptions of treatment agents in the working examples and treatment agents in the comparative examples. The results and some of the conditions are depicted in Table 1. In the table, "full film" refers to a film that has been etched over its entire surface, without the formation of trenches or holes. Some of the chemicals used are depicted at the bottom of Table 1.

Working Example 1

A reaction vessel was charged with 118 g (1.0 mol) of trimethylethoxysilane and 100 g (1.66 mol) of isopropanol. Next, at a constant temperature of 10° C., as depicted in Table 1, a mixture of 17 g (0.01 mol) of 1.0 wt % ammonia water and 37 g (0.01 mol) of a 1.0 wt % aqueous solution of ammonium fluoride was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.45.

Working Example 2

A reaction vessel was charged with 108 g (1.0 mol) of trimethylchlorosilane and 100 g (1.66 mol) of isopropanol. Next, at a constant temperature of 10° C., as depicted in Table 1, a mixture of 17 g (0.01 mol) of 1.0 wt % ammonia water and 37 g (0.01 mol) of a 1.0 wt % aqueous solution of ammonium fluoride was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.50.

Working Example 3

A reaction vessel was charged with 132 g (1.0 mol) of triethylsilanol and 150 g (2.50 mol) of isopropanol. Next, at a constant temperature of 10° C., as depicted in Table 1, a mixture of 17 g (0.01 mol) of 1.0 wt % ammonia water and 37 g (0.01 mol) of a 1.0 wt % aqueous solution of ammonium fluoride was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.45.

Working Example 4

A reaction vessel was charged with 120 g (1.0 mol) of dimethyldimethoxysilane and 150 g (2.50 mol) of isopropanol. Next, at a constant temperature of 10° C., as depicted in Table 1, a mixture of 17 g (0.01 mol) of 1.0 wt % ammonia water and 37 g (0.01 mol) of a 1.0 wt % aqueous solution of ammonium fluoride was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.23.

Working Example 5

A reaction vessel was charged with 240 g (1.0 mol) of phenyltriethoxysilane, 200 g (3.33 mol) of isopropanol, and 0.05 g (100 ppm by weight relative to the finished solution) of TN-80 (an alcohol-ethylene oxide nonionic surfactant available from Asahi Denka Kogyo; primary alcohol ethoxylate). Next, at a constant temperature of 10° C., as depicted in Table 1, a mixture of 17 g (0.01 mol) of 1.0 wt % ammonia water and 37 g (0.01 mol) of a 1.0 wt % aqueous solution of ammonium fluoride was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.13.

Working Example 6

A reaction vessel was charged with 161 g (1.0 mol) of hexamethyldisilazane and 150 g (2.50 mol) of isopropanol. Next, at a constant temperature of 10° C., as depicted in Table 1, a mixture of 17 g (0.01 mol) of 1.0 wt % ammonia water and 37 g (0.01 mol) of a 1.0 wt % aqueous solution of ammonium fluoride was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.55.

Working Examples 7 to 12

In Working Example 1, the equivalent ratio of the ammonium base to the ammonium fluoride that were mixed together was varied from 1:0.002 to 1:600 as depicted in Table 1, and post-etch treatment agents were prepared.

Working Examples 13 to 17

The amount of TN-80 added when preparing the solution in Working Example 5 was varied from 3 to 8,000 ppm by weight as depicted in Table 1, and solutions (post-etch treatment agents) were prepared.

Working Example 18

A reaction vessel was charged with 118 g (1.0 mol) of trimethylethoxysilane and 100 g (1.13 mol) of dioxane. Next, at a constant temperature of 10° C., as depicted in Table 1, a mixture of 258 g (0.01 mol) of a 1.0 wt % aqueous solution of tetra-n-butylammonium hydroxide and 66 g (0.005 mol) of a 1.0 wt % aqueous solution of dibasic ammonium phosphate was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.67.

Working Example 19

A reaction vessel was charged with 118 g (1.0 mol) of trimethylethoxysilane and 100 g (1.00 mol) of methyl isobutyl ketone. Next, at a constant temperature of 10° C., as depicted in Table 1, a mixture of 91 g (0.01 mol) of a 1.0 wt % aqueous solution of tetramethylammonium hydroxide and 63 g (0.01 mol) of a 1.0 wt % aqueous solution of ammonium formate was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.52.

Working Example 20

A reaction vessel was charged with 118 g (1.0 mol) of trimethylethoxysilane and 100 g (0.85 mol) of propylene glycol monomethyl ether. Next, at a constant temperature of 10° C., as depicted in Table 1, a mixture of 203 g (0.01 mol) of a 1.0 wt % aqueous solution of tetrapropylammonium hydroxide and 77 g (0.01 mol) of a 1.0 wt % aqueous solution of ammonium acetate was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.60.

Working Example 21

A reaction vessel was charged with 118 g (1.0 mol) of trimethylethoxysilane and 100 g (0.85 mol) of propylene glycol monopropyl ether. Next, at a constant temperature of 10° C., as depicted in Table 1, a mixture of 120 g (0.02 mol) of a 1.0 wt % aqueous solution of ethylenediamine and 90 g (0.01 mol) of 1.0 wt % aqueous solution of oxalic acid was added dropwise at a rate of 2 mL/min with a dropping funnel. Following the end of dropwise addition, stirring was carried out for 2 hours. Upon pH measurement of the resulting solution (post-etch treatment agent) with a pH meter, the solution pH was found to be 9.31.

Comparative Example 1

An aqueous solution of ammonium fluoride used as a conventional post-etch treatment agent was adjusted to 1.0 wt %. Upon pH measurement of the resulting solution with pH test paper, the solution pH was found to be 7.7.

Comparative Example 2

A solution was prepared by mixing 161 g (1.0 mol) of hexamethyldisilazane, which is used as a conventional post-etch silicon dielectric recovery treatment agent, with 161 g (2.7 mol) of isopropanol.

Treatment was carried out according to the following procedure using the solutions of the treatment agents obtained above in Working Examples 1 to 21 and the treatment agents obtained above in Comparative Examples 1 and 2.
[Full Film Evaluation]
[Treatment Method]

A 160 nm porous dielectric film made of an SiOCH-containing material and formed on a silicon wafer (Ceramate NCS; JGC Catalysts and Chemicals, Ltd.) (which film is sometimes referred to below simply as a "porous dielectric film") was etched to a depth of 20 nm with a fluorine plasma obtained from $CF_4/CHF_3$ as the starting material. The treatment agents of the working examples and the treatment agents of the comparative examples were applied thereon by 60 seconds of spin-coating at 500 rpm, following which the workpieces were placed on a hot plate set to 200° C. and dried for 60 seconds.
[Specific Dielectric Constant]

A 1 mm diameter gold electrode was fabricated on the film to be tested and the capacitance was measured using a prober connected to a 1 MHz, 1 V AC power supply. The specific dielectric constant was calculated from this capacitance and the film thickness as measured by spectroscopic ellipsometry. In addition, the amount of recovery was calculated from the difference between this specific dielectric constant and the specific dielectric constant of the porous dielectric film after etching. The specific dielectric constant of the porous dielectric film prior to etching was 2.25, and the specific dielectric constant of the porous dielectric film after etching was 3.23.
[Surface Roughness]

The presence or absence of etching residues was visually checked based on the roughness of the film surface to be tested, at an acceleration voltage of 5 kV, in a surface scanning electron micrograph at an enlargement of 50,000×.
[Amount of Etching Residues CFx]

Surface analysis was carried out by X-ray photoelectron spectroscopy, and the amount of CFx residues at the film surface was computed from the integrated value for the F1s peak.
[Corrosion of Wiring Metal (Cu)]

The percent decrease in the thickness of the copper film was measured using a profilometer. The percent decrease in copper film thickness in the table indicates the ratio of the change in film thickness following corrosion relative to the original thickness.
[Uniformity of Treatment Agent Solution Coating]

Coating unevenness was visually checked with an optical microscope at a magnification of 100×.
[Packaging Test Evaluation]

Referring to FIGS. 1 to 5, a transistor layer that was isolated by an inter-element isolation film 2, and had a gate electrode including a source diffusion layer 5a, a drain diffusion layer 5b and a sidewall silicon dielectric film 3, was formed on a silicon wafer 1 (Step 1). Next, an interlayer silicon dielectric film 6 and a stopper film 7 were formed thereon, and a contact hole for leading out an electrode was formed (Step 2).

TiO 8 was formed in the contact hole to a thickness of 50 nm by sputtering, following which a blanket of tungsten 9 was buried by mixing $WF_6$ with hydrogen and reduction, then areas other than the via were removed by chemical mechanical polishing (CMP) (Step 3).

Next, a SiOCH film (also referred to below as the "SiC film") 10 having low oxygen and hydrogen contents and high silicon and carbon contents that formed by chemical vapor deposition (CVD) was deposited to a thickness of 30 nm, the same porous dielectric film 11 (referred to below as simply the "porous dielectric film") used above (in the evaluations) was deposited to a thickness of 160 nm, and a SiC film 12 was deposited to a thickness of 30 nm (Step 4). In addition, using as the mask a resist layer provided with a first layer circuit pattern having a 100 nm linewidth and 100 nm spaces, the resulting film stack was etched with a fluorine plasma obtained from $CF_4/CHF_3$ gas as the starting material (Step 5), thereby forming a wiring trench. The SiC film 10, porous dielectric film 11 and SiC film 12 were all silicon dielectric films according to the present embodiment.

A treatment agent obtained in a working example of the embodiment or in a comparative example was then applied, by spin coating in the same way as described above, onto the film stack in which a wiring trench had been etched, following which drying was carried out.

Next, 10 nm of TaN 13, which acts as a diffusion barrier for copper to the dielectric film, and a 10 nm seed layer of copper, which acts as an electrode in electroplating, were formed in the wiring trench by sputtering. A 600 nm copper layer 14 was then deposited by electroplating, following which metal in areas other than the wiring pattern was removed by CMP and a 30 nm SiN film 15 was formed by vapor phase growth method, thereby forming a first wiring layer (Step 6). Next, a 180 nm porous dielectric film 16, a 30 nm SiC layer 17, a 160 nm porous dielectric film 18, and a 30 nm SiC film 19 were formed in this order on the wiring layer (Step 7).

Using as the mask a resist layer on which a via pattern had been formed, the SiC film 19/porous dielectric film 18/SiC film 17/porous dielectric film 16/SiN film 15 were etched in this order by varying the gas composition and pressure using a fluorine plasma prepared from $CF_4/CHF_3$ gas as the starting material. Next, using as the mask a resist layer provided with a second layer wiring pattern, etching was carried out with a fluorine plasma prepared from $CF_4/CHF_3$ gas as the starting material. The same treatment agent as that used above was then spin-coated in the same way as described above onto the film stack in which a wiring trench had been etched, and drying was carried out (Step 8). The SiC film 19, the porous dielectric film 18, the SiC film 17 and the porous dielectric film 16 were all silicon dielectric films according to the present embodiment.

A 10 nm layer of TaN 20 which acts as a diffusion barrier for copper to the dielectric film and a 10 nm seed layer of copper which acts as an electrode in electroplating were formed in the via and the wiring trench by sputtering. In addition, a copper layer 21 was deposited to a thickness of 1400 nm by electroplating, following which metal in areas other than the wiring pattern was removed by CMP (Step 9) and a 30 nm SiN film 22 was formed by vapor phase growth method, thereby forming a second wiring layer (Step 10).

The above steps were then repeated to form three-layer wiring. Using multilayer wiring structures test-produced by carrying out the above treatment with the post-etch treatment agents obtained in Working Examples 1 to 21 and in Comparative Examples 1 and 2, the yield on a 1 million via chain and the effective specific dielectric constant were calculated from the interlayer capacitance.

The above results are depicted in Table 1.

TABLE 1

Working Examples and Comparative Examples

| | Ammonia base | Ammonium salt | Silicon-containing compound | Amount of surfactant added (wt. ppm) | Ammonium base to ammonium salt (equiv. ratio) | Dielectric constant recovery |
|---|---|---|---|---|---|---|
| WE 1 | Ammonia | Ammonium fluoride | Formula 1 | 0 | 1:1 | 0.96 |
| WE 2 | | | Formula 2 | 0 | 1:1 | 0.92 |
| WE 3 | | | Formula 3 | 0 | 1:1 | 0.97 |
| WE 4 | | | Formula 4 | 0 | 1:1 | 0.94 |
| WE 5 | | | Formula 5 | 100 | 1:1 | 0.93 |
| WE 6 | | | Formula 6 | 0 | 1:1 | 0.93 |
| WE 7 | | | Formula 1 | 0 | 1:0.002 | 0.75 |
| WE 8 | | | | 0 | 1:0.01 | 0.87 |
| WE 9 | | | | 0 | 1:0.1 | 0.95 |
| WE 10 | | | | 0 | 1:10 | 0.97 |
| WE 11 | | | | 0 | 1:100 | 0.93 |
| WE 12 | | | | 0 | 1:600 | 0.82 |
| WE 13 | | | Formula 5 | 3 | 1:1 | 0.85 |
| WE 14 | | | | 10 | 1:1 | 0.91 |
| WE 15 | | | | 500 | 1:1 | 0.88 |
| WE 16 | | | | 1000 | 1:1 | 0.85 |
| WE 17 | | | | 8000 | 1:1 | 0.81 |
| WE 18 | Tetra-n-butylammonium hydroxide | Dibasic ammonium phosphate | Formula 1 | 0 | 1:1 | 0.89 |
| WE 19 | Tetramethyl-ammonium hydroxide | Ammonium formate | | 0 | 1:1 | 0.98 |
| WE 20 | Tetrapropyl-ammonium hydroxide | Ammonium acetate | | 0 | 1:1 | 0.95 |
| WE 21 | Ethylenediamine | Oxalic acid | | 0 | 1:0.5 | 0.91 |
| CE 1 | Conventional cleaner: Ammonium fluoride | | | 0 | — | −0.29 |
| CE 2 | Conventional silylating agent: | | | 0 | — | 0.19 |

TABLE 1-continued

Working Examples and Comparative Examples hexamethyldisilazane

| | Silicon dielectric film surface roughness | Etching residues CFx (at. %) | Cu corrosion (decrease in film thickness) (%) | Uniformity | Effective dielectric constant | Yield (%) |
|---|---|---|---|---|---|---|
| WE 1 | none | 0.70 | −0.4 | excellent | 2.69 | 97.4 |
| WE 2 | none | 0.97 | 1.2 | excellent | 2.70 | 95.7 |
| WE 3 | none | 0.02 | 1.0 | excellent | 2.69 | 97.4 |
| WE 4 | none | 0.79 | 1.1 | excellent | 2.70 | 97.4 |
| WE 5 | none | 1.08 | 0.5 | excellent | 2.70 | 97.4 |
| WE 6 | none | 0.03 | 0.3 | excellent | 2.70 | 95.7 |
| WE 7 | none | 1.25 | 1.3 | excellent | 2.74 | 96.7 |
| WE 8 | none | 0.22 | −0.5 | excellent | 2.71 | 96.8 |
| WE 9 | none | 0.08 | 0.9 | excellent | 2.69 | 96.2 |
| WE 10 | none | 0.11 | 1.2 | excellent | 2.69 | 92.1 |
| WE 11 | none | 0.08 | 3.4 | excellent | 2.70 | 98.8 |
| WE 12 | none | 0.13 | 7.7 | excellent | 2.72 | 89.5 |
| WE 13 | none | 1.33 | 0.3 | good | 2.71 | 91.3 |
| WE 14 | none | 1.32 | 0.9 | excellent | 2.70 | 95.8 |
| WE 15 | none | 1.26 | 0.9 | excellent | 2.71 | 96.1 |
| WE 16 | none | 1.37 | 3.5 | good | 2.71 | 90.9 |
| WE 17 | none | 1.44 | 7.9 | good | 2.74 | 89.7 |
| WE 18 | none | 0.73 | 0.6 | excellent | 2.71 | 95.3 |
| WE 19 | none | 0.25 | −0.1 | excellent | 2.69 | 98.9 |
| WE 20 | none | 0.11 | 0.2 | excellent | 2.69 | 95.2 |
| WE 21 | none | 0.20 | 0.3 | excellent | 2.70 | 93.8 |
| CE 1 | yes | 0.04 | 15.3 | some irregularity | 3.95 | 76.3 |
| CE 2 | none | 32.80 | 0.1 | excellent | 3.40 | 88.1 |

[Structural Formulas of Silicon-Containing Compounds]

Structural Formula 1: Trimethylethoxysilane

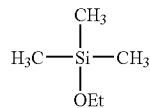

Structural Formula 2: Trimethylchlorosilane

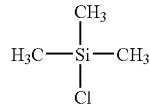

Structural Formula 3: Triethylsilanol

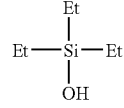

Structural Formula 4: Dimethyldimethoxysilane

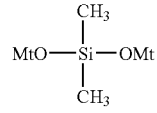

Structural Formula 5: Phenyltriethoxysilane

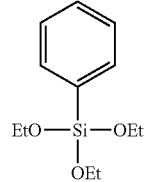

Structural Formula 6: Hexamethyldisilazane

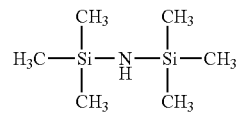

As explained above, a stacked silicon dielectric film structure and multilayer wiring having a low dielectric constant and a high reliability can be obtained using the present embodiment. Moreover, this multilayer wiring is able to contribute in particular to a higher response speed in semiconductor devices.

Figure 7:
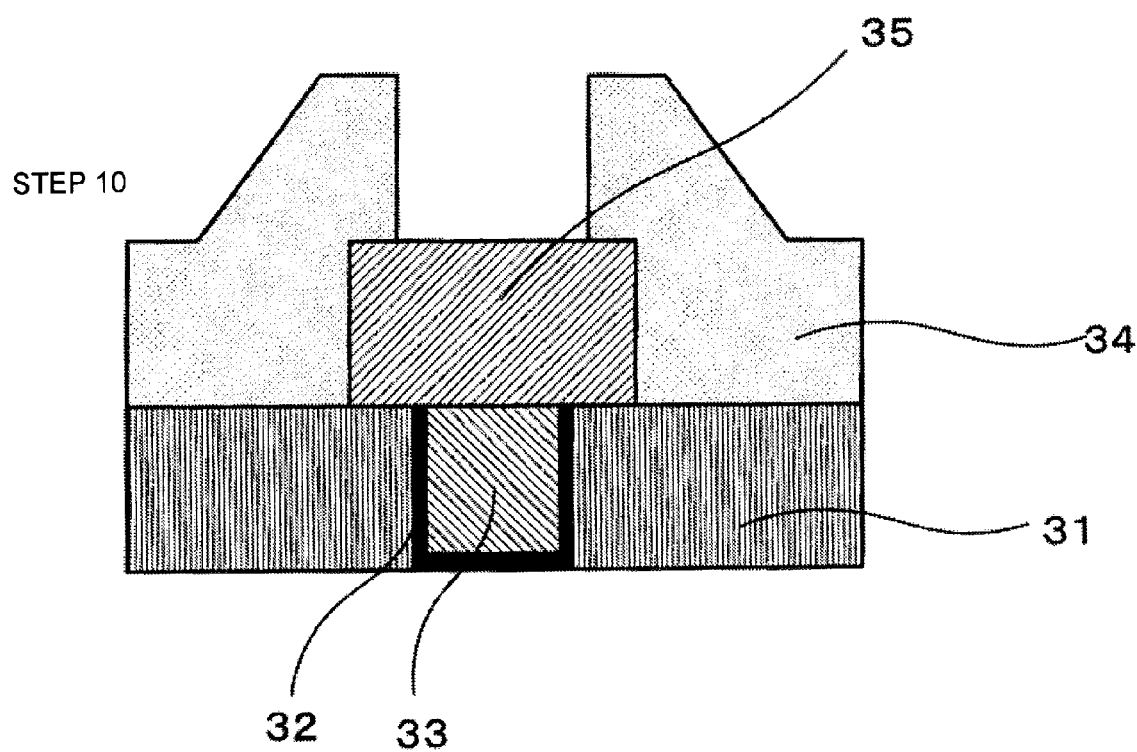

Similar structures were additionally deposited on the above-described structure, thereby creating a multilayer wiring structure having a total of six layers, at the very top of which was placed a structure composed of, as depicted in Step 11 of FIG. 7, a dielectric film (SiO$_2$, 500 nm; deposited by plasma CVD) 31 as an electrode pad-contacting layer, a TiN barrier layer 32, a tungsten-filled contact hole 33, a passivation film 34 and an electrode pad 35, thereby fabricating a semiconductor device.

According to these embodiments, it becomes possible to suppress an increase in the dielectric constant of a silicon dielectric film caused by etching. Moreover, it can suppress film separation and uneven film formation when a film is formed on an etched surface. From other perspectives, the present embodiments provide art which enables recovery from damage caused by etching and art which enables the efficient cleaning of etching residues. Therefore, the quality of products such as semiconductor devices whose manufacture includes steps in which silicon dielectric films are etched can be improved, enabling high-speed, highly reliable semiconductor devices to be achieved and also making it possible to enhance the production yield of such devices.

The invention claimed is:

1. A method for post-etch treating a silicon dielectric film, comprising:
coating the etched surface with a post-etch treatment agent comprising at least one nitrogen-containing substance selected from the group consisting of ammonium bases and amine compounds, an acid, and at least one silicon-containing compound comprising silicon, carbon and hydrogen; and
subsequently carrying out heat-treatment of the surface on which the post-etch treatment agent has been coated at a temperature in a range of from 50 to 400° C.

2. The method of claim 1, wherein the agent has a pH in a range greater than 7 and up to 10.

3. The method of claim 1, wherein the silicon-containing compound comprises a compound selected from the group consisting of compounds of formulas (1) to (3) below:

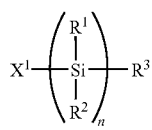
(1)

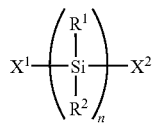
(2)

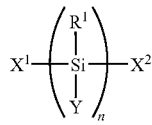
(3)

(wherein $R^1$, $R^2$ and $R^3$ are each independently a hydrogen, an aliphatic hydrocarbon of 1 to 4 carbons, or an aromatic hydrocarbon of 6 to 8 carbons which may include a substituent; $X^1$ and $X^2$ are each independently a chloro group, a hydroxyl group or an alkoxy group of 1 to 3 carbons; Y is in one occurrence, independently of other occurrences of Y and independently also of $X^1$ and $X^2$, a chloro group, a hydroxyl group or an alkoxy group of 1 to 3 carbons, and if there are two or more occurrences of Y, each additional occurrence of Y is, independently of other occurrences of Y and independently also of $R^1$ and $R^2$, a hydrogen, an aliphatic hydrocarbon of 1 to 4 carbons or an aromatic hydrocarbon of 6 to 8 carbons which may include a substituent; and n is independently an integer from 1 to 3).

4. The method of claim 1, wherein the silicon-containing compound is a compound obtained by removing at least one of the chloro group, hydroxyl group and alkoxy group of 1 to 3 carbons from among the $X^1$, $X^2$ and Y moieties in a compound selected from the group consisting of compounds of formulas (1) to (3) below, and bonding together molecules thereof through nitrogen:

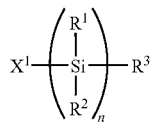
(1)

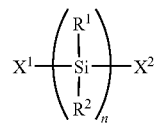
(2)

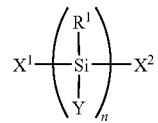
(3)

(wherein $R^1$, $R^2$ and $R^3$ are each independently a hydrogen, an aliphatic hydrocarbon of 1 to 4 carbons, or an aromatic hydrocarbon of 6 to 8 carbons which may include a substituent; $X^1$ and $X^2$ are each independently a chloro group, a hydroxyl group or an alkoxy group of 1 to 3 carbons; Y is in one occurrence, independently of other occurrences of Y and independently also of $X^1$ and $X^2$, a chloro group, a hydroxyl group or an alkoxy group of 1 to 3 carbons, and if there are two or more occurrences of Y, each additional occurrence of Y is, independently of other occurrences of Y and independently also of $R^1$ and $R^2$, a hydrogen, an aliphatic hydrocarbon of 1 to 4 carbons or an aromatic hydrocarbon of 6 to 8 carbons which may include a substituent; and n is independently an integer from 1 to 3).

5. The method of claim 1, wherein the nitrogen-containing substance is included in an amount of from 0.01 to 10 wt. %.

6. The method of claim 1, wherein the acid is included in an amount of from 0.01 to 10 wt. %.

7. The method of claim 6, wherein the equivalent ratio of the total amount of the nitrogen-containing substance to the total amount of the acid is in a range of from 1:0.001 to 1:1,000.

8. The method of claim 1, wherein the silicon-containing compound is included in an amount of from 20 to 60 wt. %.

9. The method of claim 1, wherein the agent further comprises a surfactant, wherein the surfactant is a nonionic surfactant.

10. The method of claim 9, wherein the surfactant is of at least one type selected from the group consisting of alcohol-ethylene oxide surfactants, alkylphenol-ethylene oxide surfactants and propylene-ethylene oxide block copolymer surfactants.

11. The method of claim 1, wherein the agent further comprises a surfactant, wherein the surfactant is included in an amount of from 1 to 10,000 ppm by weight.

12. A method of manufacturing a semiconductor device, comprising:
etching a silicon dielectric film in a semiconductor device;
subsequently coating the etched surface with a post-etch treatment agent comprising at least one nitrogen-containing substance selected from the group consisting of ammonium bases and amine compounds; an acid; and at least one silicon-containing compound comprising silicon, carbon and hydrogen; and
subsequently carrying out heat-treatment of the surface on which the post-etch treatment agent has been coated at a temperature in a range of from 50 to 400° C.

13. The semiconductor device manufacturing method of claim 12, wherein the silicon dielectric film is a film for insulating a wiring layer and/or a via in the semiconductor device.

14. The manufacturing method of claim 12, wherein the silicon dielectric film has a specific dielectric constant of 2.7 or less.

15. The manufacturing method of claim 12, wherein the treatment is for recovery from damage due to etching.

16. The manufacturing method of claim 12, wherein the treatment is for cleaning away etching residues.

17. A semiconductor device manufactured by the semiconductor device manufacturing method of claim 12.

18. A combination of a post-etch treatment agent and a silicon dielectric film having an etched surface, said agent comprising:
at least one nitrogen-containing substance selected from the group consisting of ammonium bases and amine compounds;
an acid; and
at least one silicon-containing compound comprising silicon, carbon and hydrogen, and
said agent being placed on the etched surface of the silicon dielectric-film,
wherein said post-etch treatment agent is coated on said silicon dielectric film.

19. The combination of claim 18, wherein the agent has a pH in a range greater than 7 and up to 10.

20. The combination of claim 18, wherein the silicon-containing compound comprises a compound selected from the group consisting of compounds of formulas (1) to (3) below:

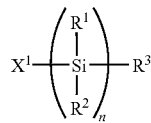
(1)

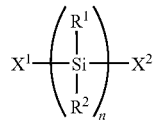
(2)

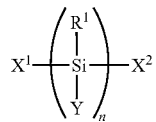
(3)

(wherein $R^1$, $R^2$ and $R^3$ are each independently a hydrogen, an aliphatic hydrocarbon of 1 to 4 carbons, or an aromatic hydrocarbon of 6 to 8 carbons which may include a substituent; $X^1$ and $X^2$ are each independently a chloro group, a hydroxyl group or an alkoxy group of 1 to 3 carbons; Y is in one occurrence, independently of other occurrences of Y and independently also of $X^1$ and $X^2$, a chloro group, a hydroxyl group or an alkoxy group of 1 to 3 carbons, and if there are two or more occurrences of Y, each additional occurrence of Y is, independently of other occurrences of Y and independently also of $R^1$ and $R^2$, a hydrogen, an aliphatic hydrocarbon of 1 to 4 carbons or an aromatic hydrocarbon of 6 to 8 carbons which may include a substituent; and n is independently an integer from 1 to 3).

21. The combination of claim 18, wherein the silicon-containing compound is a compound obtained by removing at least one of the chloro group, hydroxyl group and alkoxy group of 1 to 3 carbons from among the $X^1$, $X^2$ and Y moieties in a compound selected from the group consisting of compounds of formulas (1) to (3) below, and bonding together molecules thereof through nitrogen:

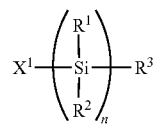
(1)

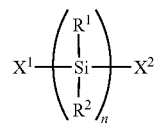
(2)

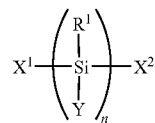
(3)

(wherein $R^1$, $R^2$ and $R^3$ are each independently a hydrogen, an aliphatic hydrocarbon of 1 to 4 carbons, or an aromatic hydrocarbon of 6 to 8 carbons which may include a substituent; $X^1$ and $X^2$ are each independently a chloro group, a hydroxyl group or an alkoxy group of 1 to 3 carbons; Y is in one occurrence, independently of other occurrences of Y and independently also of $X^1$ and $X^2$, a chloro group, a hydroxyl group or an alkoxy group of 1 to 3 carbons, and if there are two or more occurrences of Y, each additional occurrence of Y is, independently of other occurrences of Y and independently also of $R^1$ and $R^2$, a hydrogen, an aliphatic hydrocarbon of 1 to 4 carbons or an aromatic hydrocarbon of 6 to 8 carbons which may include a substituent; and n is independently an integer from 1 to 3).

22. The combination of claim 18, wherein the nitrogen-containing substance is included in an amount of from 0.01 to 10 wt. %.

23. The combination of claim 18, wherein the acid is included in an amount of from 0.01 to 10 wt. %.

24. The combination of claim 23, wherein the equivalent ratio of the total amount of the nitrogen-containing substance to the total amount of the acid is in a range of from 1:0.001 to 1:1,000.

25. The combination of claim 18, wherein the silicon-containing compound is included in an amount of from 20 to 60 wt. %.

26. The combination of claim 1, wherein the agent further comprises a surfactant, wherein the surfactant is a nonionic surfactant.

27. The combination of claim 26, wherein the surfactant is of at least one type selected from the group consisting of alcohol-ethylene oxide surfactants, alkylphenol-ethylene oxide surfactants and propylene-ethylene oxide block copolymer surfactants.

28. The combination of claim 18, wherein the agent comprises a surfactant, wherein the surfactant is included in an amount of from 1 to 10,000 ppm by weight.

* * * * *